United States Patent [19]

Rowe

[11] 4,305,854
[45] * Dec. 15, 1981

[54] RADIATION CURABLE PRESSURE SENSITIVE ADHESIVE

[75] Inventor: William Rowe, Westfield, N.J.

[73] Assignee: Polychrome Corporation, Yonkers, N.Y.

[ * ] Notice: The portion of the term of this patent subsequent to Nov. 13, 1996, has been disclaimed.

[21] Appl. No.: 79,394

[22] Filed: Sep. 27, 1979

Related U.S. Application Data

[63] Continuation-in-part of Ser. No. 929,155, Jul. 31, 1978, Pat. No. 4,174,307, which is a continuation of Ser. No. 617,614, Sep. 29, 1975, abandoned, which is a continuation of Ser. No. 315,212, Dec. 14, 1972, abandoned.

[51] Int. Cl.$^3$ .................. C08L 93/04; C08G 63/76; C08G 18/04
[52] U.S. Cl. .................. 260/24; 260/31.8 G; 204/159.16; 204/159.19; 525/440; 525/455; 525/920
[58] Field of Search .............. 528/75; 260/24, 22 TN, 260/31.8 G; 525/440, 455, 920

[56] References Cited

U.S. PATENT DOCUMENTS

| | | | |
|---|---|---|---|
| 3,100,759 | 8/1963 | Boussu et al. | 260/77.5 AM |
| 3,297,745 | 1/1967 | Fekete et al. | 260/77.5 AP |
| 3,345,311 | 10/1967 | Ehrlich et al. | 260/18 TN |
| 3,425,973 | 2/1969 | Shaw | 260/18 TN |
| 3,437,622 | 4/1969 | Dahl | 260/24 |
| 3,499,852 | 3/1970 | Schroeder et al. | 260/18 TN |
| 3,509,234 | 4/1970 | Burlant et al. | 260/77.5 CR |
| 3,553,174 | 1/1971 | Hausslein et al. | 260/77.5 CR |
| 3,600,359 | 8/1971 | Miranda | 260/18 TN |
| 3,719,638 | 7/1972 | Hulmmer et al. | 260/77.5 CR |
| 3,759,809 | 9/1973 | Carlick et al. | 260/18 TN |
| 3,782,961 | 1/1974 | Takahashi et al. | 204/159.14 |
| 3,939,126 | 2/1976 | Carder et al | 528/75 |
| 3,954,584 | 5/1976 | Miyata et al. | 204/159.24 |
| 4,013,806 | 3/1977 | Volkert et al. | 204/159.19 |
| 4,112,017 | 9/1978 | Howard | 525/440 |
| 4,116,786 | 9/1978 | Hodakowski | 525/455 |
| 4,188,455 | 2/1980 | Howard | 528/75 |

OTHER PUBLICATIONS

Saunders et al., Polyurethanes, Part I; Interscience (New York, 1962) pp. 150-160.
Same, Part II, pp. 300-303.

*Primary Examiner*—H. S. Cockeram

[57] ABSTRACT

A pressure sensitive adhesive formed by exposure of a mixture comprising (I) a liquid, substantially water-insoluble monomeric composition, containing zero percent free isocyanate groups, which comprises the reaction product of (i) one equivalent of an isocyanate containing intermediate which is, itself, the reaction product of about one equivalent of an organic, monomeric compound containing more than one active hydrogen with two equivalents of an organic polyisocyanate, and (ii) one equivalent of a monomeric olefinically unsaturated compound containing exactly one active group; (II) a tackifier and (III) a polymerization inhibitor to a source of ultraviolet or electron beam radiation whereby the composition is rendered tacky.

14 Claims, No Drawings

RADIATION CURABLE PRESSURE SENSITIVE ADHESIVE

CROSS REFERENCE TO RELATED APPLICATIONS

This application is a continuation-in-part of U.S. patent application, Ser. No. 929,155, filed July 31, 1978 now U.S. Pat. No. 4,174,307 issued Nov. 13, 1979 which was a continuation of U.S. patent application, Ser. No. 617,614, filed Sept. 29, 1975, now abandoned, which was a continuation of U.S. patent application, Ser. No. 315,212, filed Dec. 14, 1972, now abandoned.

INCORPORATION BY REFERENCE

This application relates to novel urethane type pressure sensitive adhesives which employ materials more fully described in my U.S. Pat. No. 4,174,307. Therefore, this application specifically incorporates by reference my disclosure in U.S. Pat. No. 4,174,307 issued Nov. 13, 1979.

BACKGROUND OF THE INVENTION

This invention relates to radiation curable coatings which cure to provide a pressure sensitive adhesive surface.

Pressure sensitive adhesive (P.S.A.) coatings from aqueous or solvent systems are themselves well known and in common use. The conventional pressure sensitive adhesive systems are made up of rubbery type polymers (elastomeric) and tackifiers (hard resins) which contain extenders, plasticizers and other modifying materials, as needed, in either an aqueous or solvent based medium. These conventional P.S.A. are formulated in a range of 25% to 55% (approximate) total solids in aqueous or solvent media, resulting in the consumption of large quantities of energy for curing and the related problems of solvent removal.

This invention relates to energy curable pressure sensitive adhesives based on a liquid modified urethane oligomer and a non-reactive resinous tackifier, whereby, when cured in-situ under an energy source (UV or EB) it will produce a final product (P.S.A.) comparable to conventional solvent or water base systems, meeting the technical definition of a P.S.A. as given by the "Pressure Sensitive Tape Council". The term pressure sensitive adhesive is used to designate a distinct category of adhesive tapes and adhesives which in dry (solvent free) form are agressively and permanently tacky at room temperature and firmly adhere to a variety of dissimilar surfaces upon mere contact without the need of more than finger or hand pressure. They require no activation by water, solvent or heat in order to exert a strong adhesive holding force toward such materials as paper, cellophane, glass, wood and metals. They have a sufficiently cohesive tackiness, they can be handled with the fingers and removed from smooth surfaces without leaving a residue.

SUMMARY OF THE INVENTION

As hereinbefore mentioned, the present invention provides a radiation curable pressure sensitive adhesive material which prior to cure is a liquid and after exposure to ultraviolet or electron beam radiation is rendered permanently tacky. This adhesive composition comprises the admixture of, I. a substantially water insoluble, monomeric composition which comprises the reaction product of,
   A. one equivalent of an isocyanate containing intermediate which is the reaction product of,
     (i) about one equivalent of an organic, monomeric compound which contains more than one active hydrogen with,
     (ii) two equivalents of an organic polyisocyanate and,
   B. one equivalent of a monomeric olefinically unsaturated compound containing exactly one active hydrogen; said composition being a monomeric, solvent free liquid containing zero percent free isocyanate groups; and
II. a tackifier; and
III. a polymerization inhibitor; and
IV. an optional photoinitiator; and
V. an optional monounsaturated diluent; and
VI. an optional polyunsaturated diluent; and
VII. an optional plasticizer.

Typically this admixture is applied as a liquid to a substrate, typically a flexible substrate such as paper, mylar or polyethylene and exposed to an electron beam radiation source to produce a tacky polymerized product adhered to the substrate. If ultraviolet radiation is to be employed to effect the cure then the photoinitiator is a necessary rather than optional ingredient.

It is therefore an object of the present invention to provide a liquid composition free of solvents which when exposed to radiation is cured to the permanently tacky state.

It is another object of the present invention to provide pressure sensitive adhesives which are not solutions or emulsions of high molecular weight polymers.

DETAILED DESCRIPTION OF THE PREFERRED EMBODIMENT

As a preferred embodiment, the pressure sensitive adhesive composition comprises the admixture of, in percent by weight of the final composition, I. From about 30% to about 90% of a substantially water insoluble monomeric composition which comprises, the reaction product of,
   A. one equivalent of an isocyanate containing intermediate which is the reaction product of,
     (i) about one equivalent of an organic, monomeric compound which contains more than one active hydrogen with,
     (ii) two equivalents of an organic polyisocyanate and,
   B. one equivalent of a monomeric olefinically unsaturated compound containing exactly one active hydrogen; said composition being a monomeric, solvent free liquid containing zero percent free isocyanate groups; and
II. From 10% to 60% of a tackifier; and
III. From 0.1% to 3% of a polymerization inhibitor; and
IV. From 0% to 15% of a photoinitiator; and
V. From 0% to 30% of a mono-unsaturated diluent; and
VI. From 0% to 10% of a polyunsaturated diluent;
VII. From 0% to 10% of a plasticizer.

The production of composition I is described in my U.S. Pat. No. 4,174,307 issued Nov. 13, 1979. Preferred tackifiers include ester gums, rosin, dimer rosin, and in effect any hard resin compatible with said composition I, that will not interfere with the radiation exposure reaction of composition I and allows the adhesive composition to remain permanently tacky.

Preferred polymerization inhibitors are those which effectively prevent polymerization of the adhesive ingredients prior to exposure to the radiation source. These include both heat and ultraviolet radiation polymerization inhibitors such as hydroquinone. Such are also described as the stabilizers in my aforementioned U.S. Pat. No. 4,174,307.

Photoinitiators are described in my aforementioned U.S. Pat. No. 4,174,307. A most preferred photoinitiator is a dialkoxyacetophenone.

Preferred mono-unsaturated and polyunsaturated diluents include the unsaturated acrylates and methacrylates. Such are described in my pending Patent application, however, preferred mono-unsaturated diluents include dicyclopentanyl ethoxy acrylate and tetrahydrofurfural acrylate. Preferred polyunsaturated diluents include trimethylolpropane triacrylate, hexanediol diacrylate and pentaerithitol triacrylate.

Plasticizers, in addition to those described in my pending patent application include alkyd resins, polyesters, and phthalates which are non-drying.

EXAMPLE 1

Charge 100 pts. Composition I which is prepared as described in U.S. Pat. No. 4,174,307 (issued Nov. 13, 1979), 33 pts. Tetrahydrofurfural Acrylate, 1.25 pts. para-Methoxy Phenol, and 0.99 pts. Hydroquinone to a reactor/kettle with mild agitation and heat to 155° F. to 160° F. under a total reflux with a nitrogen blanket.

Once a temperature of 155° F. has been reached, add 100 parts Staybelite (TM) Ester-10 (ester gum available from Hercules Chemical) to the reactor as fast as it will dissolve without the formation of agglomerations of resin. Continue mixing at this temperature (155° F. to 160° F.) until there are no particles of resin remaining and the entire mixture is smooth and clear, hot and cold pill.

When this point is reached, the entire batch is cooled to 130° F. to 140° F. Add 20 parts of Staybelite (TM) Ester-3 (ester gum available from Hercules Chemical), followed by 3.8 pts. Trimethylolpropanetriacrylate. Agitation should be continued after the addition for 15 minutes to insure a homogeneous blend/mixture.

6.8 parts of the photoinitiator, diethoxyacetophenone available as Irgacure I-651 from Ciba Geigy, should be added now, while the batch is reaching the lower temperature level. Maintain a temperature above 120° F. during this addition and mix only long enough to insure dissolution of the I-651 and a homogeneous material.

While temperature is still above 120° F. remove and pass the material through a strainer (approximately 44 mesh) into adequate size containers for storage out of light.

All agitation in the above procedure should be of a mild nature, except during addition of Staybelite Ester-10, when the agitation should be at a maximum without a vortex.

Application and Curing

This composition has the appearance of a heavy amber syrup with an intrinsic viscosity ranging from around 10,000 cps to 50,000 cps. Using either a Bird Film Applicator or Meyer Rod draw-downs are possible. Normally, a 0.75 mil to 1.25 mil adhesive layer is applied to a 1.5 mil non-treated polyester substrate to form an adhesive film.

The film is then cured under a 200 watt/lin. in. Conrad Hanovia UV-lamp at 10 to 15 fpm without an inert atmosphere.

Physical Properties

Following the accepted testing procedures as outlined by "Pressure Sensitive Tape Council" and "American Society For Testing And Materials" for P.S.A. films, the above cured procedure will have the following properties:

Peel 180°∠—25 oz. to 30 oz.
Shear 500 gms/178°∠—8 or more hours
Peel 90°∠—30 oz. to 35 oz.

These procedures are described in the publication, *Test Methods For Pressure Sensitive Tapes, Sixth Edition* by the Specifications and Technical Committee of the Pressure Sensitive Tape Council, Glenview, Ill.

EXAMPLE 2

Example 1 was repeated without the Stabelite Ester 3, similar results were noticed.

EXAMPLE 3

Mixing Procedure

Following the same method as given in example 1, charge 100 pts. Composition I which is prepared as described in U.S. Pat. No. 4,174,307 (issued Nov. 13, 1979) and 33 pts. Rohm & Haas Diluent dicyclopentaryl ethoxy acrylate and 0.99 pts. hydroquinone, into a reactor; heat to 150° F. and then add 100 pts. Hercules Staybelite (TM) Ester-10 as quickly as possible.

When this point is reached, the entire batch is cooled to 130° F. to 140° F. Add 20 parts of Staybelite (TM) Ester-3 (ester gum available from Hercules Chemical), followed by 3.8 pts. Trimethoylolpropanetriacrylate. Agitation should be continued after the add for 15 minutes to insure a homogeneous blend/mixture.

6.8 parts of the photoinitiator, diethoxyacetophenone available as Irgacure I-651 from Ciba Geigy, should be added now, while the batch is reaching the lower temperature level. Maintain a temperature about 120° F. during this addition and mix only long enough to insure dissolution of the I-651 and a homogeneous material.

While temperature is still above 120° F. remove and pass the material through a strainer (approximately 44 mesh) into adequate size containers for storage out of light.

All agitation in the above procedure should be of a mild nature, except during addition of Staybelite Ester-10, when the agitation should be at a maximum without a vortex.

Application and Curing

Follow the same procedure outlined in Example 1.

Test Results

180°∠peel—52 oz. (clean)
178°∠/500 gm. shear 30+days

EXAMPLE 4

Mixing Procedure

Follow procedure outlined in Example 1 with 100 pts. Composition I which is prepared as described in U.S. Pat. No. 4,174,307 (issued Nov. 13, 1979), 56 pts. Hercules Staybelite (TM) Ester—10 as tackifier, 19 pts. Tetrahydrofurfural Acrylate, 1.5 pts. Trimethylolpropanetricrylate; and 2.5 pts. 1-Ethylhexylacrylate as diluents and 3.5 pts. Ciba Geigy Irgacure (TM) 651 as photoinitiator.

Application and Curing

Follow same procedure as outlined in Example 1.

Test Results

180°∠peel—35 oz. (clean)
178°∠/520 gm. Shear 200 mins.

EXAMPLE 5

Example 1 was repeated substituting Hexanedioldiacrylate for Trimethylolpropanetriacrylate.

Mixing Procedure

Same as Example 1.

Application and Curing

Same as Example 1.

Physical Properties

Same as Example 1 except shear values will be lower—more in the range of 6 to 8 hours.

What is claimed is:

1. A composition comprising the admixture of:
   I. a substantially water insoluble, monomeric composition which comprises the reaction product of,
      A. one equivalent of an isocyanate containing intermediate which is the reaction product of,
         (i) about one equivalent of an organic, monomeric compound which contains more than one active hydrogen with,
         (ii) two equivalents of an organic polyisocyanate and, B. one equivalent of a monomeric olefinically unsaturated compound containing exactly one active hydrogen;
      said composition being a monomeric, solvent free liquid containing zero percent free isocyanate groups; and an effective amount of
   II. a tackifier; and
   III. a polymerization inhibitor; and
   IV. an optional photoinitiator; and
   V. an optional mono-unsaturated diluent; and
   VI. an optional polyunsaturated diluent; and
   VII. an optional plasticizer.

2. The composition of claim 1 comprising:
   I. from about 30% to about 90% of a substantially water insoluble monomeric composition which comprises, the reaction product of,
      A. one equivalent of an isocyanate containing intermediate which is the reaction product of,
         (i) about one equivalent of an organic, monomeric compound which contains more than one active hydrogen with,
         (ii) two equivalents of an organic polyisocyanate and,
      B. one equivalent of a monomeric olefinically unsaturated compound containing exactly one active hydrogen;
      said composition being a monomeric, solvent free liquid containing zero percent free isocyanate groups; and
   II. from 10% to 60% of a tackifier; and
   III. from 0.1% to 3% of a polymerization inhibitor; and
   IV. from 0% to 15% of a photoinitiator; and
   V. from 0% to 30% of a mono-unsaturated diluent; and
   VI. from 0% to 10% of a polyunsaturated diluent; and
   VII. from 0% to 10% of a plasticizer.

3. The composition of claim 1 wherein said compound (i) is a polyol.

4. The composition of claim 1 wherein said polyisocyanate is a diisocyanate.

5. The composition of claim 1 wherein said compound (B) is an acrylate or methacrylate.

6. The composition of claim 1 wherein compound (i) is a triol.

7. The composition of claim 1 wherein said tackifier is selected from the group consisting of ester gums, rosin, and dimer rosin.

8. The composition of claim 1 wherein said polymerization inhibitor is a hydroquinone.

9. The composition of claim 1 wherein said photoinitiator is a dialkoxyacetophenone.

10. The composition of claim 1 wherein said mono-unsaturated diluent is selected from the group consisting of dicyclopentanyl ethoxy acrylate and tetrahydrofurfural acrylate.

11. The composition of claim 1 wherein said polyunsaturated diluent is selected from the group consisting of trimethylolpropane triacrylate, hexandiol diacrylate and pentaerithritol triacrylate.

12. The composition of claim 1 wherein said plasticizer is selected from the group consisting of non-drying alkyd resins, polyesters and phthalates.

13. The composition of claim 2 comprising a tackifier selected from the group consisting of ester gums, rosin, and dimer rosin; and a hydroquinone polymerization inhibitor; and a dialkoxyacetophenone photoinitiator; and a mono-unsaturated diluent selected from the group consisting of dicyclopentanyl ethoxy acrylate and tetrahydrofurfural acrylate; and a polyunsaturated diluent selected from the group consisting of trimethylolpropane triacylate, hexandiol diacrylate and pentaerithritol triacylate; and a plasticizer selected from the group consisting of non-drying alkyd resins, polyesters and phthalates.

14. An element comprising a substrate having coated on at least one surface thereof the composition of claim 1, 2, or 13.

* * * * *